(12) United States Patent
Kawasumi et al.

(10) Patent No.: US 11,923,661 B2
(45) Date of Patent: Mar. 5, 2024

(54) SURFACE EMITTING LASER AND METHOD OF MANUFACTURING THE SAME

(71) Applicant: SONY SEMICONDUCTOR SOLUTIONS CORPORATION, Kanagawa (JP)

(72) Inventors: Takayuki Kawasumi, Kanagawa (JP); Hideki Kimura, Kanagawa (JP); Kota Tokuda, Kanagawa (JP); Yoshiaki Watanabe, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 632 days.

(21) Appl. No.: 17/260,876

(22) PCT Filed: Jun. 14, 2019

(86) PCT No.: PCT/JP2019/023619
§ 371 (c)(1),
(2) Date: Jan. 15, 2021

(87) PCT Pub. No.: WO2020/017206
PCT Pub. Date: Jan. 23, 2020

(65) Prior Publication Data
US 2021/0328408 A1    Oct. 21, 2021

(30) Foreign Application Priority Data
Jul. 20, 2018 (JP) .................. 2018-136388

(51) Int. Cl.
*H01S 5/183* (2006.01)
*H01S 5/227* (2006.01)

(52) U.S. Cl.
CPC ...... *H01S 5/18311* (2013.01); *H01S 5/18344* (2013.01); *H01S 5/18377* (2013.01); *H01S 5/2275* (2013.01)

(58) Field of Classification Search
CPC .................................................. H01S 5/18377
(Continued)

(56) References Cited

U.S. PATENT DOCUMENTS

| 2001/0050934 A1* | 12/2001 | Choquette | H01S 5/1833 |
| | | | 372/50.11 |
| 2003/0185268 A1* | 10/2003 | Zhang | H01S 5/18308 |
| | | | 372/96 |

FOREIGN PATENT DOCUMENTS

| JP | H07-226535 A | 8/1995 |
| WO | 2005/074080 A1 | 8/2005 |

OTHER PUBLICATIONS

International Search Report issued in connection with PCT/JP2019/023619, dated Sep. 10, 2019.

* cited by examiner

*Primary Examiner* — Tuan N Nguyen
(74) *Attorney, Agent, or Firm* — K&L Gates LLP

(57) ABSTRACT

A method of manufacturing a surface emitting laser according to an embodiment of the present disclosure includes the following two steps:
(1) a step of forming a semiconductor stacked structure on a substrate, the semiconductor stacked structure including an active layer, a first DBR layer of a first electrical conduction type, and a second DBR layer of a second electrical conduction type, the first DBR layer and the second DBR layer sandwiching the active layer, the second electrical conduction type being different from the first electrical conduction type; and
(2) a step of forming a mesa section at a portion on the second DBR layer side in the semiconductor stacked structure and then forming an annular diffusion region of the first electrical conduction type at an outer edge of the mesa section by impurity diffusion from a side (Continued)

surface of the mesa section, the mesa section including the second DBR layer, the mesa section not including the active layer.

14 Claims, 11 Drawing Sheets

(58) Field of Classification Search
USPC .................................................. 372/50.124
See application file for complete search history.

[ FIG. 1 ]
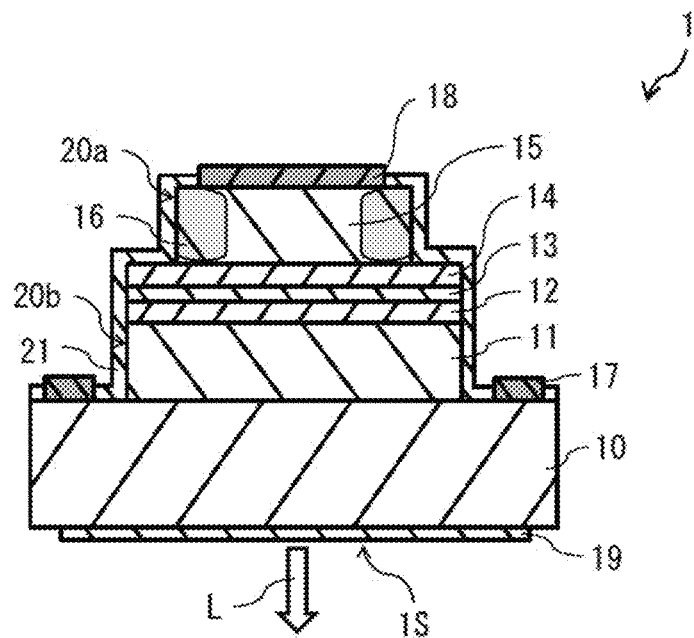
[ FIG. 2 ]
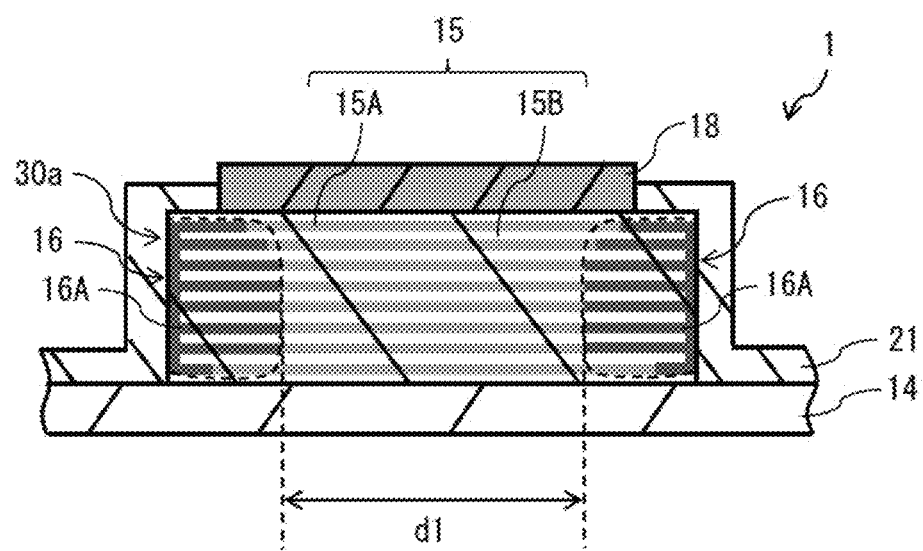

[ FIG. 3 ]
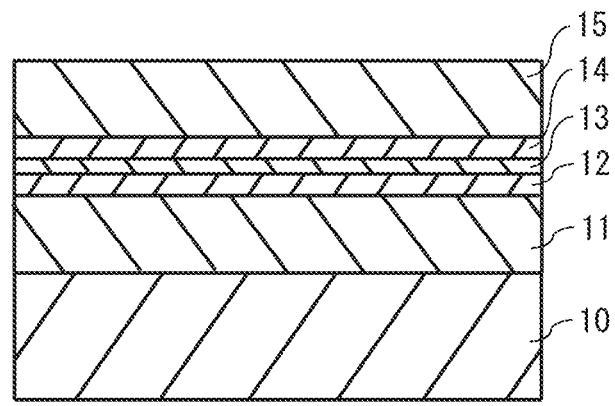
[ FIG. 4 ]
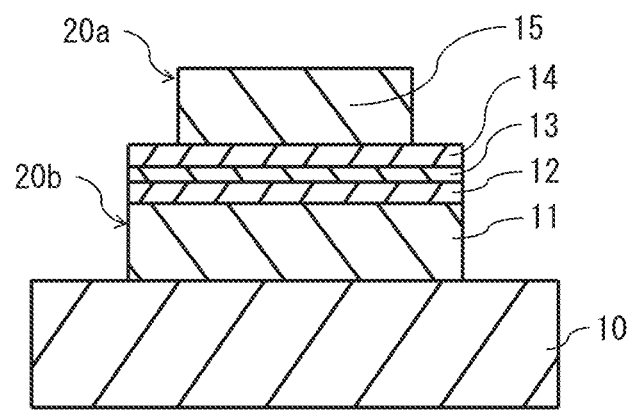

[ FIG. 5 ]
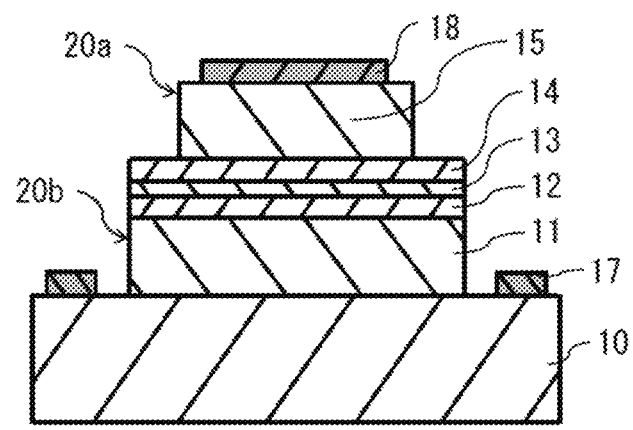
[ FIG. 6 ]
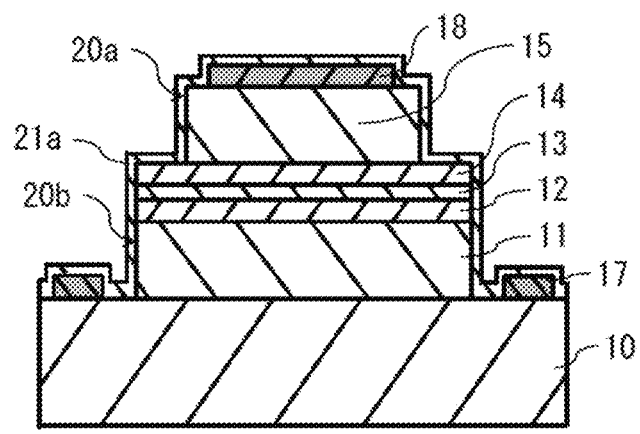

[ FIG. 7 ]
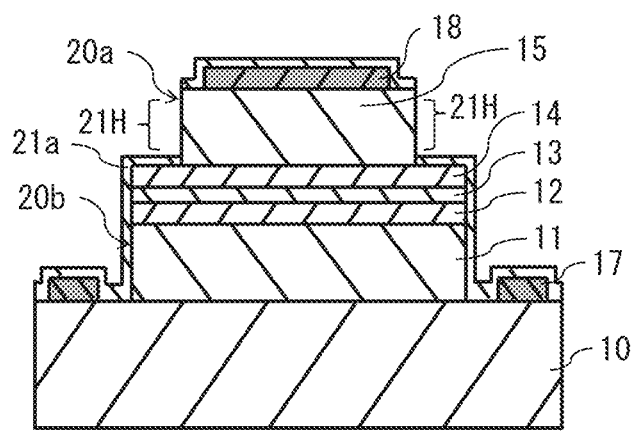
[ FIG. 8 ]
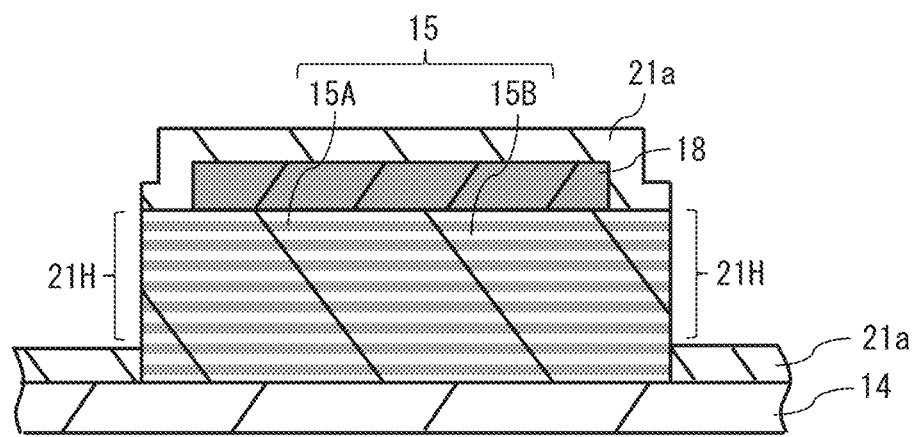

[ FIG. 9 ]
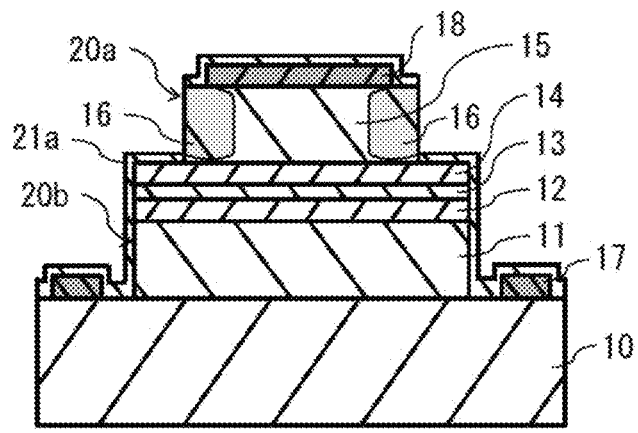
[ FIG. 10 ]
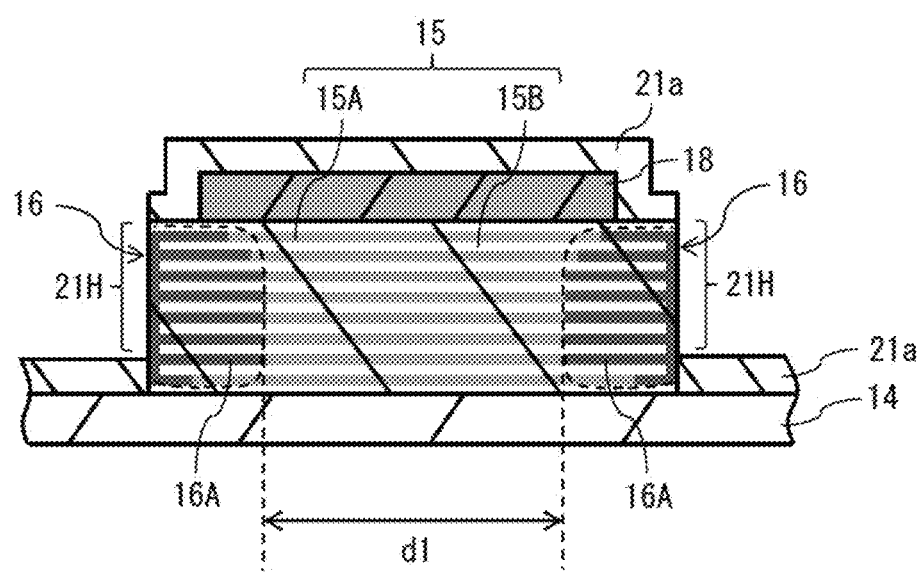

[ FIG. 11 ]
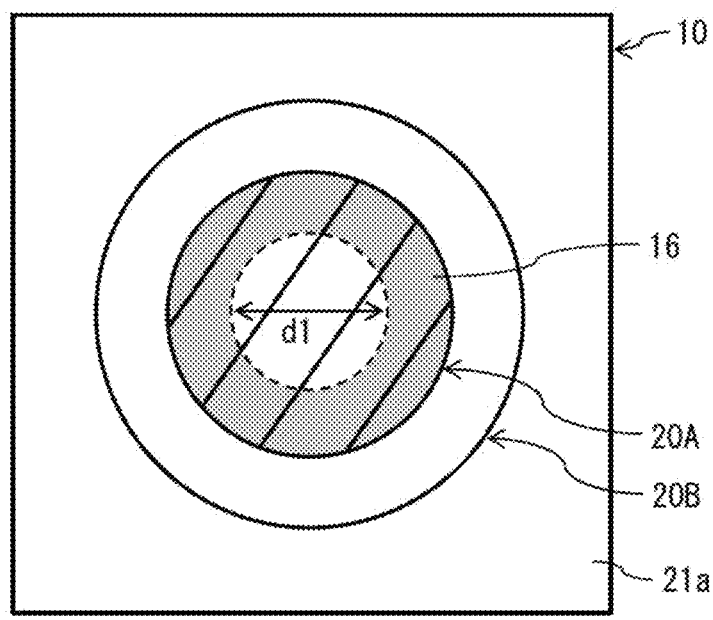
[ FIG. 12 ]
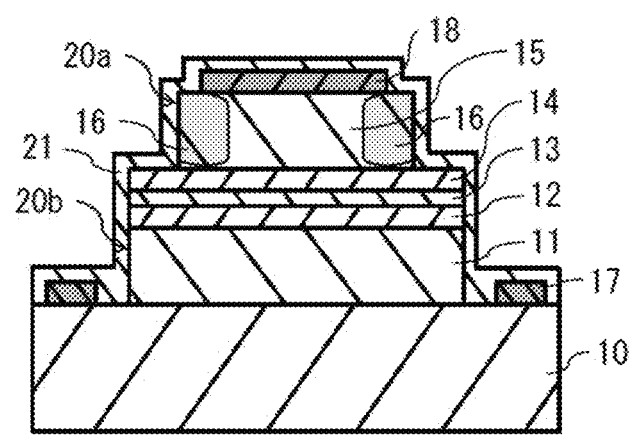

[FIG. 13]
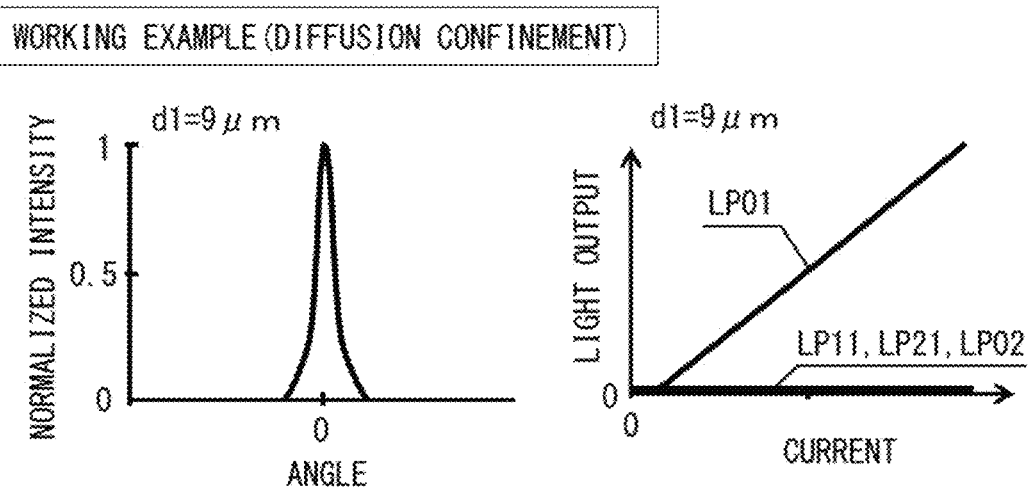

[ FIG. 14 ]
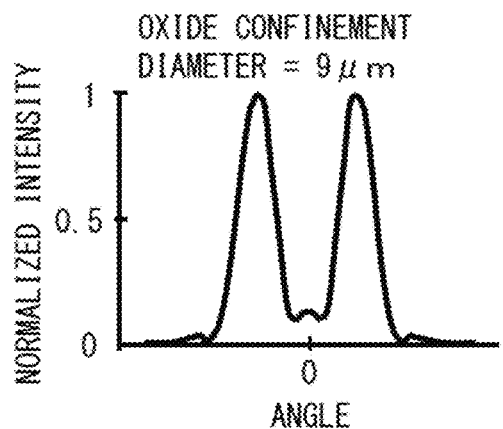
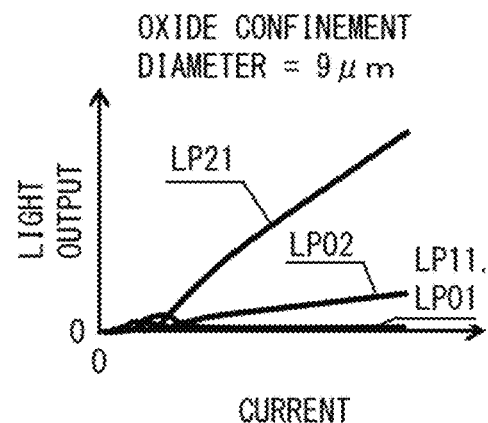
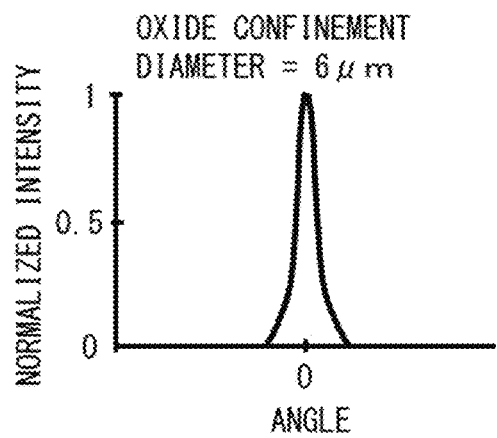
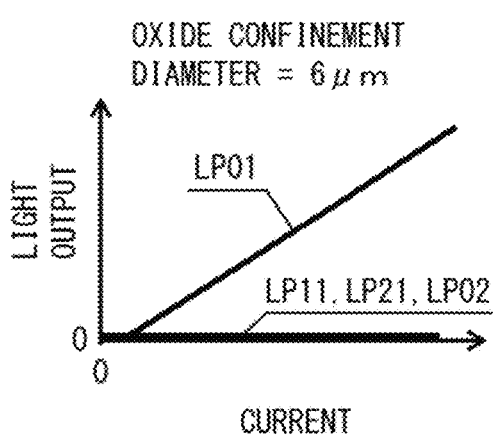
[ FIG. 15 ]
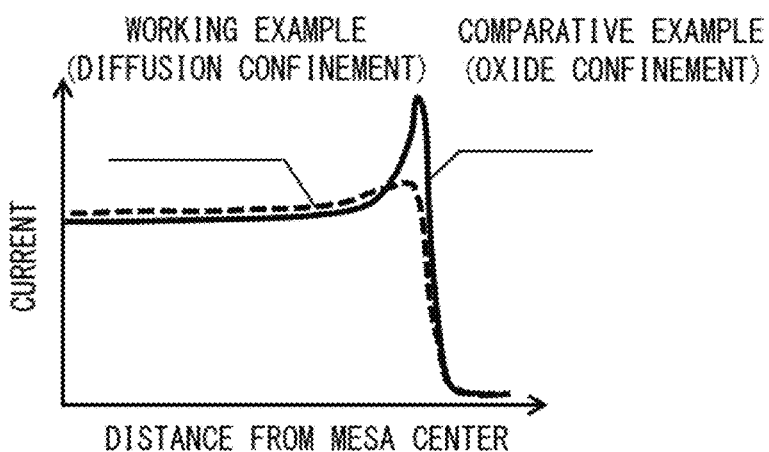

[ FIG. 16 ]
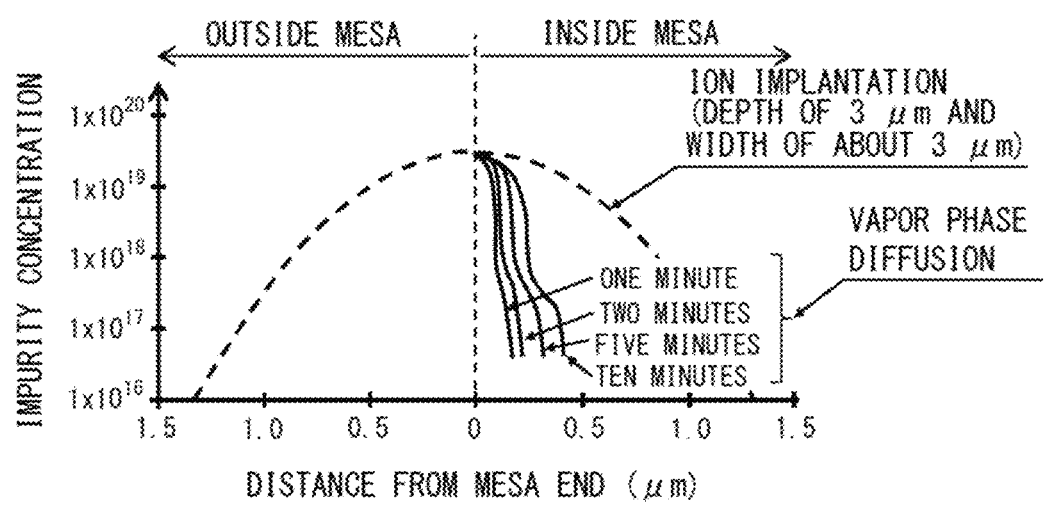

[FIG. 17]
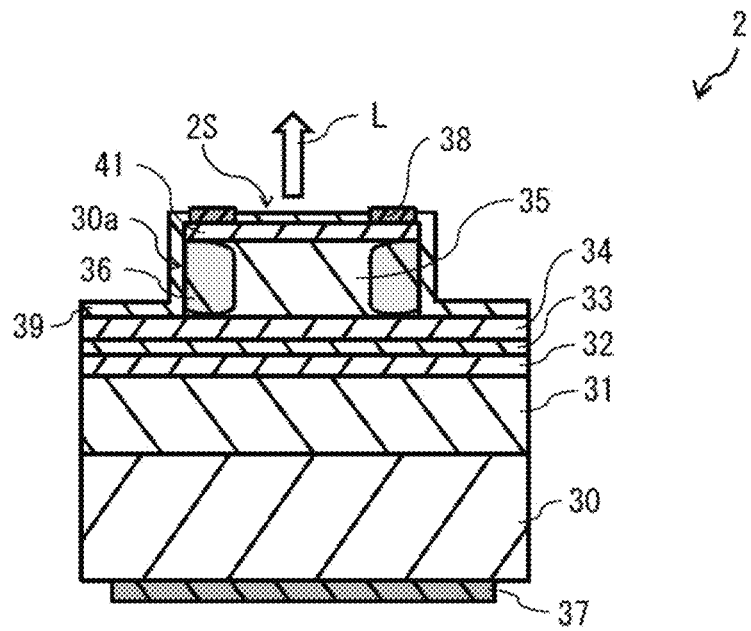
[FIG. 18]
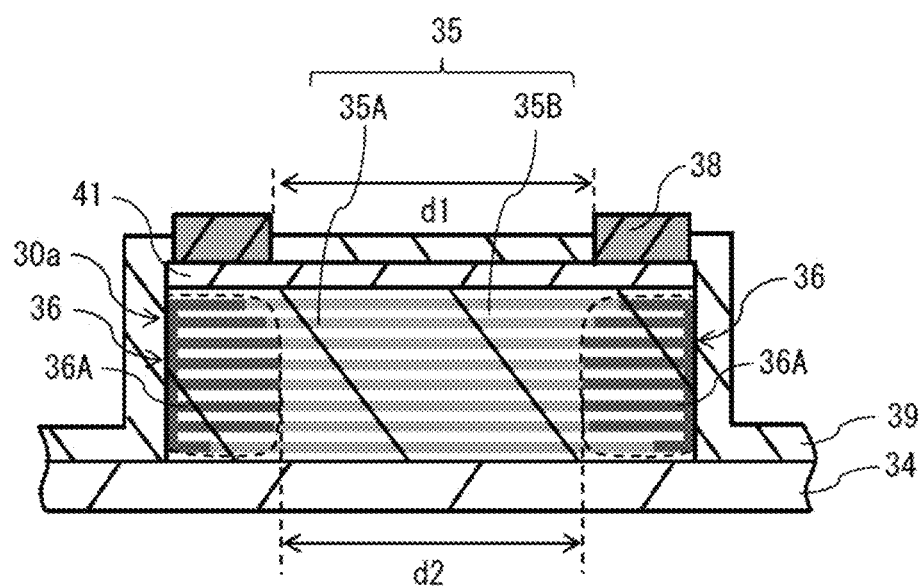

[ FIG. 19 ]
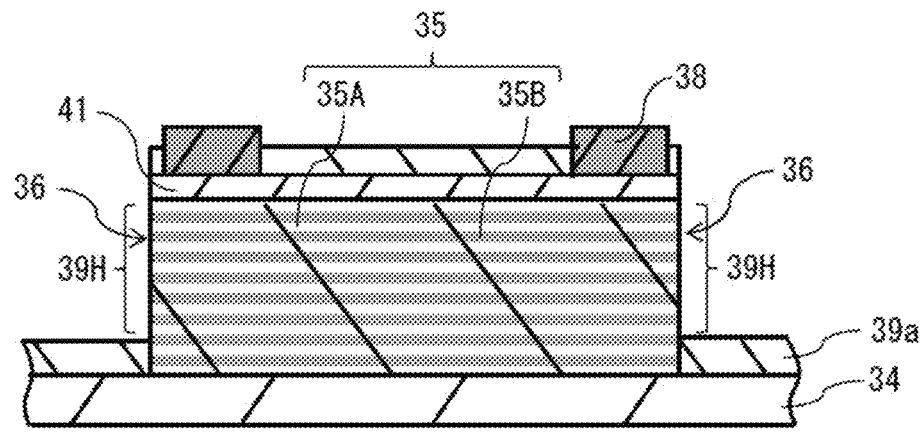
[ FIG. 20 ]
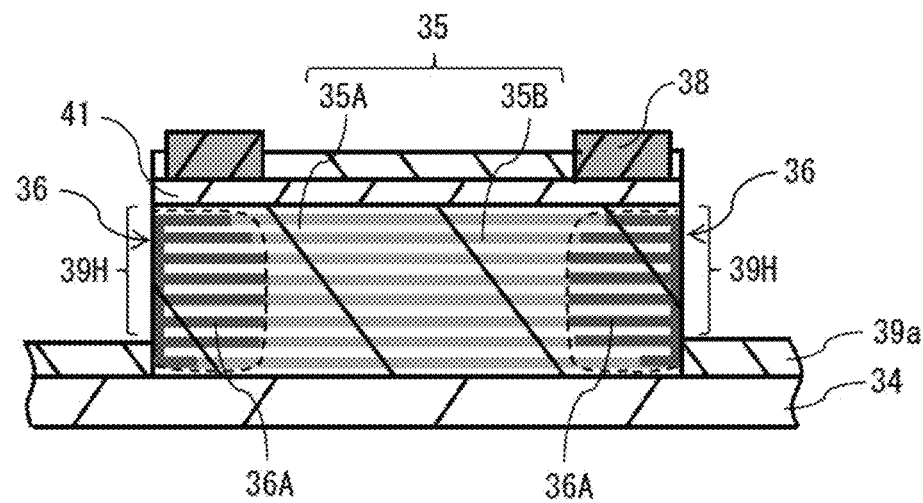

SURFACE EMITTING LASER AND METHOD OF MANUFACTURING THE SAME

TECHNICAL FIELD

The present disclosure relates to a surface emitting laser and a method of manufacturing the same.

BACKGROUND ART

In general, in a surface emitting laser, a current confinement layer is formed by oxide confinement from a ridge side surface.

CITATION LIST

Patent Literature

PTL 1: Japanese Unexamined Patent Application Publication No. 2014-075492

SUMMARY OF THE INVENTION

However, in a case where the current confinement layer is formed by oxide confinement, a high-order mode is likely to occur because of a large refractive index difference. While it is possible to suppress the occurrence of the high-order mode by decreasing the confinement diameter, decreasing the confinement diameter is a disadvantageous condition for higher-power output. In addition, in a case where the current confinement layer is formed by oxide confinement, defect growth is easily accelerated by current concentration at a confinement end and there is still room for improvement in terms of reliability. It is desirable to provide a surface emitting laser that makes it possible to increase reliability while both suppressing a high-order mode and attaining higher-power output and a method of manufacturing the same.

A method of manufacturing a surface emitting laser according to an embodiment of the present disclosure includes the following two steps:

(1) a step of forming a semiconductor stacked structure on a substrate, the semiconductor stacked structure including an active layer, a first DBR (distributed Bragg reflector) layer of a first electrical conduction type, and a second DBR layer of a second electrical conduction type, the first DBR layer and the second DBR layer sandwiching the active layer, the second electrical conduction type being different from the first electrical conduction type; and (2) a step of forming a mesa section at a portion on the second DBR layer side in the semiconductor stacked structure and then forming an annular diffusion region of the first electrical conduction type at an outer edge of the mesa section by impurity diffusion from a side surface of the mesa section, the mesa section including the second DBR layer, the mesa section not including the active layer.

In the method of manufacturing the surface emitting laser according to the embodiment of the present disclosure, the annular diffusion region of the electrical conduction type different from the electrical conduction type of the second DBR layer is formed at the outer edge of the mesa section by the impurity diffusion from the side surface of the mesa section. Here, the impurity diffusion does not cause a high refractive index difference as caused by oxide confinement. The high-order mode is therefore unlikely to occur even in a case where the confinement diameter is increased. In addition, the current concentration at the confinement end as in oxide confinement does not occur in the diffusion region formed by the impurity diffusion. This suppresses the acceleration of defect growth.

A surface emitting laser according to an embodiment of the present disclosure includes a semiconductor stacked structure on a substrate. The semiconductor stacked structure includes an active layer, a first DBR (distributed Bragg reflector) layer of a first electrical conduction type, and a second DBR layer of a second electrical conduction type. The first DBR layer and the second DBR layer sandwich the active layer. The second electrical conduction type is different from the first electrical conduction type. The semiconductor stacked structure includes the mesa section on the second DBR layer side and further includes the annular diffusion region of the first electrical conduction type at the outer edge of the mesa section. The mesa section includes the second DBR layer, but does not include the active layer.

In the surface emitting laser according to the embodiment of the present disclosure, the annular diffusion region of the electrical conduction type different from the electrical conduction type of the second DBR layer is formed at the outer edge of the mesa section. Here, in the diffusion region, a high refractive index difference as caused by oxide confinement is not caused. The high-order mode is therefore unlikely to occur even in a case where the confinement diameter is increased. In addition, the current concentration at the confinement end as in oxide confinement does not occur in the diffusion region. This suppresses the acceleration of defect growth.

BRIEF DESCRIPTION OF DRAWING

FIG. 1 is a diagram illustrating a cross-sectional configuration example of a surface emitting laser according to a first embodiment of the present disclosure.

FIG. 2 is an enlarged view of a mesa section of the surface emitting laser in FIG. 1.

FIG. 3 is a diagram illustrating an example of a manufacturing process of the surface emitting laser illustrated in FIG. 1.

FIG. 4 is a diagram illustrating an example of a manufacturing process subsequent to FIG. 3.

FIG. 5 is a diagram illustrating an example of a manufacturing process subsequent to FIG. 4.

FIG. 6 is a diagram illustrating an example of a manufacturing process subsequent to FIG. 5.

FIG. 7 is a diagram illustrating an example of a manufacturing process subsequent to FIG. 6.

FIG. 8 is an enlarged view of a mesa section in FIG. 7.

FIG. 9 is a diagram illustrating an example of a manufacturing process subsequent to FIG. 7.

FIG. 10 is an enlarged view of a mesa section in FIG. 9.

FIG. 11 is a diagram illustrating a cross-sectional configuration example of a mesa section in FIG. 9 in a stacked in-plane direction.

FIG. 12 is a diagram illustrating an example of a manufacturing process subsequent to FIG. 9.

FIG. 13 is a diagram illustrating examples of FFP and an I-L characteristic of a surface emitting laser according to a working example.

FIG. 14 is a diagram illustrating examples of FFP and an I-L characteristic of a surface emitting laser according to a comparative example.

FIG. 15 is a diagram illustrating an example of current distribution of each of the surface emitting lasers according to the working example and the comparative example.

FIG. 16 is a diagram illustrating examples of impurity concentration distribution obtained by forming a diffusion region by using vapor phase diffusion and impurity concentration distribution obtained by forming an equivalent to a diffusion region by using ion implantation.

FIG. 17 is a diagram illustrating a cross-sectional configuration example of a surface emitting laser according to a second embodiment of the present disclosure.

FIG. 18 is an enlarged view of a mesa section of the surface emitting laser in FIG. 17.

FIG. 19 is a diagram illustrating an example of a manufacturing process of the surface emitting laser illustrated in FIG. 17.

FIG. 20 is a diagram illustrating an example of a manufacturing process subsequent to FIG. 19.

MODES FOR CARRYING OUT THE INVENTION

The following describes modes for carrying out the present disclosure in detail with reference to the drawings. The following description is a specific example of the present disclosure, but the present disclosure is not limited to the following modes. In addition, the present disclosure is not limited to the disposition, dimensions, dimensional ratios, and the like of the respective components illustrated in the drawings. It is to be noted that description is given in the following order.

1. First Embodiment
Example in which a p-type diffusion region is provided in an n-type DBR layer of a back-surface emitting laser
2. Second Embodiment
Example in which a p-type diffusion region is provided in an n-type DBR layer of a top-surface emitting laser

1. First Embodiment

[Configuration]

A surface emitting laser 1 according to a first embodiment of the present disclosure is described. FIG. 1 illustrates a cross-sectional configuration example of the surface emitting laser 1.

The surface emitting laser 1 is a back-surface emitting laser that is favorably applicable to a light source or the like for a sensor required to have high-power and stable light intensity distribution. The light source for a sensor is used, for example, for object detection, object recognition, night vision (imaging is performed without being sensed by a person), distance measurement, and the like. The light source for a sensor is applicable in a wide range, for example, a car collision preventing sensor, smartphone face authentication, monitoring, security, military use, and the like.

The surface emitting laser 1 includes a vertical resonator on a substrate 10. The vertical resonator is configured to be oscillated by two DBR (distributed Bragg reflector) layers 11 and 15 at oscillation wavelength $\lambda_0$. The two DBR (distributed Bragg reflector) layers 11 and 15 are opposed to each other in the normal direction of the substrate 10. The DBR layer 11 corresponds to a specific example of a "first DBR layer" of the present disclosure. The DBR layer 15 corresponds to a specific example of a "second DBR layer" of the present disclosure. The DBR layer 11 is formed, for example, in contact with the top surface of the substrate 10.

The DBR layer 15 is formed, for example, at a position relatively away from the substrate 10 (i.e., position away from a light output surface 1S described below) in comparison with the DBR layer 11. The surface emitting laser 1 is configured to output laser light L from the DBR layer 11 side. Therefore, the surface emitting laser 1 is a back-surface emitting laser having the light output surface 1S on the back surface.

The surface emitting laser 1 includes a semiconductor stacked structure on the substrate 10. The semiconductor stacked structure includes the DBR layer 11, a spacer layer 12, an active layer 13, a spacer layer 14, and a DBR layer 15 in this order from the substrate 10 side. That is, the spacer layer 14 is formed between the active layer 13 and the DBR layer 15. The spacer layer 14 corresponds to a specific example of a "third semiconductor layer" of the present disclosure. The semiconductor stacked structure includes a columnar mesa section 20a on the DBR layer 15 side and further includes an annular diffusion region 16 at the outer edge of the mesa section 20a. The columnar mesa section 20a includes the DBR layer 15, but does not include the active layer 13. The semiconductor stacked structure further includes a columnar mesa section 20b on the substrate 10 side. The columnar mesa section 20b has a greater diameter than the diameter of the mesa section 20a and includes the active layer 13. The mesa section 20a is formed in contact with the top surface of the mesa section 20b. The mesa section 20b is provided between the substrate 10 and the mesa section 20a. The mesa section 20b is formed in contact with the top surface of the substrate 10 and the bottom surface of the mesa section 20a.

The surface emitting laser 1 further includes electrode layers 17 and 18 for injecting currents into the semiconductor stacked structure. The electrode layer 17 is formed, for example, in contact with the surface of the substrate 10 on the mesa section 20a and 20b sides. The electrode layer 18 is formed, for example, in contact with the top surface of the mesa portion 20a (e.g., DBR layer 15). The surface emitting laser 1 further includes, for example, an AR (anti-reflection) layer 19 provided in contact with the back surface of the substrate 10 as required. The surface emitting laser 1 further includes an insulating layer 21 covering the mesa sections 20a and 20b. The electrode layers 17 and 18 are not covered with the insulating layer 21, but are exposed to the outside.

The substrate 10 is a crystal growth substrate used for the epitaxial crystal growth of a semiconductor stacked structure. The substrate 10 and the semiconductor stacked structure each include, for example, a GaAs-based semiconductor.

The substrate 10 is a substrate that transmits light emitted from the active layer 13. For example, the substrate 10 is a p-type GaAs substrate. The p type corresponds to a specific example of a "first electrical conduction type" of the present disclosure. The p-type GaAs substrate includes, for example, zinc (Zn), carbon (C), magnesium (Mg), beryllium (Be), or the like as a p-type impurity. The DBR layer 11 is a p-type DBR layer. The DBR layer 11 is, for example, a multilayer film reflecting mirror obtained by alternately stacking low refractive index layers and high refractive index layers. The low refractive index layers each include, for example, p-type $Al_{a1}Ga_{1-a1}As$ ($0<a1<1$) having an optical thickness of $\lambda_0/4$ ($\lambda_0$ represents the oscillation wavelength). The oscillation wavelength $\lambda_0$ is, for example, 940 nm. The high refractive index layers each include, for example, p-type $Al_{a2}Ga_{1-a2}As$ ($0 \leq a2 < a1$) having an optical thickness of $\lambda_0/4$. The low refractive index layers each include a material having a higher Al (aluminum) composition ratio than that of a high refractive index layer. The DBR layer 11 includes, for example, zinc (Zn), carbon (C), magnesium (Mg), beryllium (Be), or the like as a p-type impurity. In the DBR layer 11, for example, a1 is 0.9, a2 is 0.1, and the number of pairs of low refractive index layers and high refractive index layers is 20.

The active layer 13 is designed in accordance with the oscillation wavelength $\lambda_0$ and use. The active layer 13 includes, for example, a stack in which well layers and barrier layers are alternately stacked. The well layer includes, for example, $In_{0.05}Ga_{0.95}As$ having a thickness of 5 nm. The barrier layer includes, for example, $Al_{0.1}Ga_{0.9}As$ having a thickness of 5 nm. The spacer layer 12 includes, for example, p-type GaAs. The spacer layer 12 includes, for example, zinc (Zn), carbon (C), magnesium (Mg), beryllium (Be), or the like as a p-type impurity. The spacer layer 14 is formed between the active layer 13 and the DBR layer 15. More specifically, the spacer layer 14 is formed between the diffusion region 16 and the active layer 13. The spacer layer 14 includes a semiconductor layer having a lower Al composition ratio than that of a low refractive index layer 15A described below. The spacer layer 14 includes, for example, n-type GaAs. The spacer layer 14 includes, for example, silicon (Si) and the like as an n-type impurity. The total optical thickness of the spacer layer 12, the active layer 13, and the spacer layer 14 is, for example, equal to the oscillation wavelength $\lambda_0$. The region of the active layer 13 opposed to an opening of the diffusion region 16 serves as a light emitting region when a current is injected into the surface emitting laser 1.

The DBR layer 15 is an n-type DBR layer. The n type corresponds to a specific example of a "second electrical conduction type" of the present disclosure. The DBR layer 15 is, for example, a multilayer film reflecting mirror obtained by alternately stacking the low refractive index layers 15A and high refractive index layers 15B as illustrated in FIG. 2. The low refractive index layers 15A each correspond to a specific example of a "first semiconductor layer" of the present disclosure. The high refractive index layers 15B each correspond to a specific example of a "second semiconductor layer" of the present disclosure. The low refractive index layer 15A is a semiconductor layer having a relatively higher Al composition ratio than that of the high refractive index layer 15B. The low refractive index layer 15A includes, for example, n-type $Al_{a3}Ga_{1-a3}As$ (0<a3<1) having an optical thickness of $\lambda_0/4$. The high refractive index layer 15B is a semiconductor layer having a relatively lower Al composition ratio than that of the low refractive index layer 15A. The high refractive index layer 15B includes, for example, n-type $Al_{a4}Ga_{1-a4}As$ (0≤a4<a3) having an optical thickness of $\lambda_0/4$. The low refractive index layer 15A includes a material having a higher Al (aluminum) composition ratio than that of the high refractive index layer 15B. The Al composition ratio of $Al_{a3}Ga_{1-a3}As$ in the low refractive index layer 15A is higher than the Al composition ratio of $Al_{a4}Ga_{1-a4}As$ in the high refractive index layer 15B. The DBR layer 15 includes, for example, silicon (Si) and the like as an n-type impurity. In the DBR layer 15, for example, a3 is 0.9, a4 is 0.1, and the number of pairs of the low refractive index layers 15A and the high refractive index layers 15B is 22, which is larger than the number of pairs in the DBR layer 11.

The diffusion region 16 confines the current injected into the active layer 13. The diffusion region 16 is an impurity diffusion region of an electrical conduction type (p type) different from the electrical conduction type (n type) of the DBR layer 15. The diffusion region 16 has an opening for confining the current injected into the active layer 13. A diameter d1 of the opening of the diffusion region 16 is, for example, 6.6 µm, 8.8 µm, or 14.4 µm. The diffusion region 16 has, for example, a ring shape. For example, as illustrated in FIG. 2, the diffusion region 16 includes a plurality of layered diffusion sections 16A. The diffusion sections 16A are each formed at the end of the low refractive index layer 15A and have, for example, a ring shape. The diffusion region 16 is provided in every low refractive index layer 15A in the DBR layer 15 and has a comb shape. The diffusion region 16 is formed in every low refractive index layer 15A in the DBR layer 15 by impurity diffusion in the DBR layer 15. The one or more high refractive index layers 15B are formed between the diffusion region 16 and the active layer 13. The one or more high refractive index layers 15B are closer to the active layer 13 in the DBR layer 15.

The electrode layers 17 and 18 each have a role as an external terminal of the surface emitting laser 1. The electrode layer 17 is electrically coupled to the substrate 10. The electrode layer 17 is formed, for example, in contact with a portion located on the top surface of the substrate 10 and corresponding to the foot of the mesa section 20b. The electrode layer 17 includes, for example, titanium (Ti), platinum (Pt), and gold (Au) that are stacked in this order from the substrate 10 side. The electrode layer 18 is provided at least at a portion opposed to the opening of the diffusion region 16 and is formed in contact with the top surface of the mesa section 20a. The electrode layer 18 has, for example, a circular shape. The electrode layer 18 has a structure in which, for example, an alloy of gold (Au) and germanium (Ge), nickel (Ni), and gold (Au) are stacked in order from the top surface side of the DBR layer 15. The electrode layer 18 is electrically coupled to the DBR layer 15. The insulating layer 21 is formed by using an insulating material. The insulating layer 21 is formed by using, for example, SiN or $Al_2O_3$.

[Manufacturing Method]

Next, a method of manufacturing the surface emitting laser 1 according to the present embodiment is described. FIGS. 3 to 12 illustrate an example of a manufacturing procedure of the surface emitting laser 1.

To manufacture the surface emitting laser 1, a compound semiconductor is collectively formed on the substrate 10 including, for example, p-type GaAs, for example, in an epitaxial crystal growth method such as an MOCVD (Metal Organic Chemical Vapor Deposition: metal organic chemical vapor deposition) method. In this case, for example, a methyl-based organic metal gas such as trimethylaluminum (TMAl), trimethylgallium (TMGa), or trimethylindium (TMIn) and an arsine ($AsH_3$) gas are used as raw materials of the compound semiconductor. For example, disilane ($Si_2H_6$) is used as a raw material of a donor impurity. For example, CBr4 is used as a raw material of an acceptor impurity.

First, a semiconductor stacked structure is formed on the surface of the substrate 10, for example, in an epitaxial crystal growth method such as a MOCVD method (FIG. 3). The semiconductor stacked structure includes the DBR layer 11, the spacer layer 12, the active layer 13, the spacer layer 14, and the DBR layer 15. That is, the spacer layer 14 is formed between the active layer 13 and the DBR layer 15. Next, for example, a circular resist layer (not illustrated) is formed. Afterward, the DBR layer 15 is selectively etched with this resist layer used as a mask and the semiconductor stacked structure is etched to depth that does not reach the active layer 13. In this case, it is preferable to use, for example, RIE (Reactive Ion Etching) with a Cl-based gas. In this way, for example, as illustrated in FIG. 4, the mesa section 20a is formed at a portion on the DBR layer 15 side in the semiconductor stacked structure. The mesa section 20a includes the DBR layer 15, but does not include the active layer 13. In this case, the mesa section 20a is formed not to include the spacer layer 14. Subsequently, a circular resist layer (not illustrated) is formed on the surface including the surface of the mesa section 20a. Afterward, the DBR layer 11, the spacer layer 12, the active layer 13, and the spacer layer 14 are selectively etched with this resist layer used as a mask. In this case, it is preferable to use, for example, RIE (Reactive Ion Etching) with a Cl-based gas. In this way, for example, as illustrated in FIG. 4, the mesa section 20b including the active layer 13 is formed.

Next, the electrode layer 18 and the electrode layer 17 are formed (FIG. 5). The electrode layer 18 is in contact with the top surface of the mesa section 20a (e.g., DBR layer 15). The electrode layer 17 is in contact with a portion located on the top surface of the substrate 10 and corresponding to the foot of the mesa section 20b. Afterward, an insulating layer 21a is formed that covers the mesa sections 20a and 20b and the electrode layers 17 and 18 (FIG. 6). Subsequently, an opening 21H is formed in the insulating layer 21a by isotropic etching such as wet etching (FIGS. 7 and 8). Specifically, the opening 21H is formed on the side surface of the mesa section 20a that is a portion having relatively less film thickness in the insulating layer 21a. In this case, the opening 21H may be formed to prevent the end surfaces of the one or more high refractive index layers 15B closer to the active layer 13 in the DBR layer 15 from being exposed in the opening 21H (FIG. 8).

In this way, the insulating layer 21a having the opening 21H is formed on the side surface of the mesa section 20a. Afterward, the annular diffusion region 16 is formed at the outer edge of the mesa portion 20a (FIGS. 9, 10, and 11) by impurity diffusion from the side surface of the mesa section 20a. The annular diffusion region 16 is of the electrical conduction type (p type) different from the electrical conduction type (n type) of the DBR layer 15. Specifically, the diffusion region 16 is formed by impurity diffusion via the opening 21H by vapor phase diffusion. In this case, as an impurity of electrical conduction type (p type) different from the electrical conduction type (n type) of the DBR layer 15, for example, Zn is diffused to form the diffusion region 16.

Here, the low refractive index layer 15A is a semiconductor layer having a relatively higher Al composition ratio than that of the high refractive index layer 15B. Therefore, of the low refractive index layer 15A and the high refractive index layer 15B exposed in the opening 21H, the low refractive index layer 15A having a relatively high Al composition ratio has a relatively higher diffusion rate than that of the high refractive index layer 15B. As a result, p-type impurities are preferentially diffused in the low refractive index layer 15A to form the diffusion region 16 in the shape of a comb (FIG. 10).

In this case, as with the high refractive index layer 15B, the spacer layer 14 is a semiconductor layer having a relatively lower Al composition ratio than that of the low refractive index layer 15A. Therefore, the spacer layer 14 acts as a stop layer for vapor phase diffusion. In addition, of the plurality of high refractive index layers 15B included in the DBR layer 15, the layer that is the closest to the active layer 13 also acts as a stop layer for vapor phase diffusion. This prevents vapor phase diffusion from reaching the active layer 13.

Next, an insulating layer is formed to fill the opening 21H, thereby forming the insulating layer 21 (FIG. 12). Next, openings are formed in the insulating layer 21 at portions opposed to the electrode layers 17 and 18. Further, the AR layer 19 is formed as required (FIG. 1). In this way, the surface emitting laser 1 is manufactured.

[Operation]

When a predetermined voltage is applied between the electrode layer 17 electrically coupled to the DBR layer 11 and the electrode layer 18 electrically coupled to the DBR layer 15 in the surface emitting laser 1 having such a configuration, currents confined by the diffusion region 16 are injected into the active layer 13, thereby causing light emission to occur as a result of recombination of electrons and holes. As a result, the vertical resonator generates laser oscillation at the oscillation wavelength $\lambda_o$. Light leaking out of the DBR layer 11 is then outputted from the light output surface 1S to the outside as the beam-shaped laser light L.

[Effects]

Next, effects of the surface emitting laser 1 according to the present embodiment are described with reference to a comparative example.

FIG. 13 illustrates examples of the FFP and I-L characteristics of the surface emitting laser 1 according to a working example. The upper portion of FIG. 13 illustrates a simulation result in which the diameter d1 of the opening of the diffusion region 16 is 14.4 µm. The lower portion of FIG. 13 illustrates a simulation result in which the diameter d1 of the opening of the diffusion region 16 is 8.8 µm. The right portion of FIG. 13 illustrates I-L characteristics and the left portion of FIG. 13 illustrates FFP.

FIG. 14 illustrates examples of the FFP and I-L characteristics of a surface emitting laser according to the comparative example. In the comparative example, a current is confined by an oxide confinement layer. The upper portion of FIG. 14 illustrates a result in which the oxide confinement diameter is 8.8 µm and the lower portion of FIG. 14 illustrates a result in which the oxide confinement diameter is 6.0 µm. The right portion of FIG. 14 illustrates I-L characteristics and the left portion of FIG. 14 illustrates FFP.

FIG. 13 illustrates that the surface emitting laser 1 according to the working example performs the basic mode operation with the high-order mode suppressed in a case where the diameter d1 of the opening of the diffusion region 16 is 8.8 µm. In addition, FIG. 13 also illustrates that, even in a case where the diameter d1 of the opening of the diffusion region 16 is as large as 14.4 µm, the basic mode operation is performed with the high-order mode suppressed in a case of low currents.

Meanwhile, FIG. 14 illustrates that the surface emitting laser according to the comparative example performs the basic mode operation with the high-order mode suppressed in a case where the oxide confinement diameter is 6.0 µm. However, FIG. 14 illustrates that the high-order mode is dominant in a case where the oxide confinement diameter is as large as 8.8 µm.

The results have such a difference because of the refractive index distribution in a mesa in the radial direction. In the surface emitting laser according to the comparative example, the refractive index difference between the oxidized portion and the non-oxidized portion is large. The high-order mode is thus more dominant as the oxide confinement diameter is increased. That is, the surface emitting laser according to the comparative example is required to have a smaller oxide confinement diameter to suppress the high-order mode. However, in such a case, the small oxide confinement diameter hinders higher-power output. In contrast, in the surface emitting laser 1 according to the working example, the refractive index difference between the diffusion region 16 and the opening of the diffusion region 16 is extremely small in comparison with the refractive index difference in a case of the comparative example. The surface emitting laser 1 according to the working example is therefore able to attain higher-power output than the surface emitting laser according to the comparative example because the basic mode operation is dominant with the high-order mode suppressed even in a case where the current confinement diameter (diameter d1 of the opening of the diffusion region 16) is large.

FIG. 15 illustrates an example of the current distribution of each of the surface emitting lasers according to the working example and the comparative example. FIG. 15 illustrates a simulation result of current density at an active layer position. FIG. 15 illustrates that no current concentration at a confinement end as in the comparative example occurs in the working example. The acceleration of defect growth caused by the current concentration is thus suppressed in the working example in comparison with the comparative example.

FIG. 16 illustrates examples of impurity concentration distribution obtained by forming the diffusion region 16 by using vapor phase diffusion and impurity concentration distribution obtained by forming an equivalent to the diffusion region 16 by using ion implantation. It is to be noted that, in a case of ion implantation, it is necessary to perform ion implantation on portions corresponding to the inside of a mesa and the outside of the mesa before the mesa is formed. FIG. 16 therefore illustrates both the impurity concentration inside a mesa and the impurity concentration outside the mesa. In addition, FIG. 16 illustrates a result obtained by performing ion implantation on a region having a depth of 3 μm and a width of about 3 μm. In addition, FIG. 16 exemplifies results obtained by performing vapor phase diffusion for one minute, two minutes, five minutes, and ten minutes. In FIG. 16, both the impurity concentration in ion implantation and the impurity concentration in vapor phase diffusion have peak values of $1\times10^{19}$ cm$^{-3}$.

FIG. 16 illustrates that the impurity concentration gradient is steeper in vapor phase diffusion than in ion implantation. In addition, FIG. 16 also illustrates that control over the time of vapor phase diffusion allows the impurity concentration distribution to be controlled with accuracy. This demonstrates that it is easier to control the current confinement diameter in vapor phase diffusion than in ion implantation.

In the surface emitting laser 1 according to the present embodiment, the annular diffusion region 16 of an electrical conduction type (p type) different from the electrical conduction type (n type) of the DBR layer 15 is formed at the outer edge of the mesa section 20a. Here, in the diffusion region 16, a high refractive index difference as caused by oxide confinement is not caused. The high-order mode is therefore unlikely to occur even in a case where the current confinement diameter is increased. In addition, the current concentration at the confinement end as in oxide confinement does not occur in the diffusion region 16. This suppresses the acceleration of defect growth. It is thus possible to increase reliability while both suppressing the high-order mode and attaining higher-power output.

In the surface emitting laser 1 according to the present embodiment, the diffusion region 16 is provided in every low refractive index layer 15A in the DBR layer 15 and has a comb shape. This prevents local current confinement in the DBR layer 15 in the thickness direction and thus makes it possible to increase reliability.

In the surface emitting laser 1 according to the present embodiment, the high refractive index layer 15B is formed between the diffusion region 16 and the active layer 13. The high refractive index layer 15B is closer to the active layer 13 in the DBR layer 15. This causes the high refractive index layer 15B to act as a stop layer for vapor phase diffusion. As a result, vapor phase diffusion does not reach the active layer 13. This makes it possible to prevent an electrical short circuit between the diffusion region 16 and the active layer 13.

In the surface emitting laser 1 according to the present embodiment, the spacer layer 14 is formed between the diffusion region 16 and the active layer 13. This causes the spacer layer 14 to act as a stop layer for vapor phase diffusion. As a result, vapor phase diffusion does not reach the active layer 13. This makes it possible to prevent an electrical short circuit between the diffusion region 16 and the active layer 13.

In the surface emitting laser 1 according to the present embodiment, an Al composition ratio a3 of $Al_{a3}Ga_{1-a3}As$ in the low refractive index layer 15A is higher than an Al composition ratio a4 of $Al_{a4}Ga_{1-a4}As$ in the high refractive index layer 15B. Therefore, of the low refractive index layer 15A and the high refractive index layer 15B exposed in the opening 21H, the low refractive index layer 15A having a relatively high Al composition ratio has a relatively higher diffusion rate than that of the high refractive index layer 15B in a case of vapor phase diffusion. As a result, p-type impurities are preferentially diffused in the low refractive index layer 15A and the diffusion region 16 has a comb shape. In this case, it is possible to control the thickness of the diffusion region 16 in the stacking direction by using the number of low refractive index layers 15A exposed in the opening 21H. It is thus possible to control the distance of the diffusion region 16 from the active layer 13 with accuracy.

In the surface emitting laser 1 according to the present embodiment, the DBR layer 15 is of an n-type electrical conduction type and the diffusion region 16 is a p-type electrical conduction type. It is extremely easy to diffuse p-type electrical conduction type of impurities in an n-type electrical conduction type of semiconductor layer. It is thus possible to easily form the diffusion region 16 in the DBR layer 15.

In the method of manufacturing the surface emitting laser 1 according to the present embodiment, the mesa section 20a is formed at a portion on the DBR layer 15 side in the semiconductor stacked structure and the p-type annular diffusion region 16 is then formed at the outer edge of the mesa section 20a by impurity diffusion from the side surface of the mesa section 20a. The mesa section 20a includes the DBR layer 15, but does not include the active layer 13. Here, in the diffusion region 16, a high refractive index difference as caused by oxide confinement is not caused. The high-order mode is therefore unlikely to occur even in a case where the current confinement diameter is increased. In addition, the current concentration at the confinement end as in oxide confinement does not occur in the diffusion region 16. This suppresses the acceleration of defect growth. It is thus possible to increase reliability while both suppressing the high-order mode and attaining higher-power output.

In the method of manufacturing the surface emitting laser 1 according to the present embodiment, the insulating layer 21a having the opening 21H is formed on the side surface of the mesa section 20a and the diffusion region 16 is then formed by impurity diffusion via the opening 21H. This makes it possible to selectively perform vapor phase diffusion on a portion of the DBR layer 15 exposed in the opening 21H. It is thus possible to control the distance of the diffusion region 16 from the active layer 13 with accuracy.

In the method of manufacturing the surface emitting laser 1 according to the present embodiment, the opening 21H is formed in the insulating layer 21a by isotropic etching. In this way, it is possible to form the opening 21H at a portion of the insulating layer 21a opposed to the side surface of the DBR layer 15 in a simple method. This makes it possible to form the diffusion region 16 in a simple method.

In the method of manufacturing the surface emitting laser 1 according to the present embodiment, the insulating layer 21a is formed and the diffusion region 16 is then formed in the shape of a comb by impurity diffusion in each low refractive index layer 15A exposed in the opening 21H. In this case, it is possible to control the thickness of the diffusion region 16 in the stacking direction by using the number of low refractive index layers 15A exposed in the opening 21H. It is thus possible to control the distance of the diffusion region 16 from the active layer 13 with accuracy.

In the method of manufacturing the surface emitting laser 1 according to the present embodiment, the opening 21H is formed to prevent the end surfaces of the one or more high refractive index layers 15B closer to the active layer 13 in the DBR layer 15 from being exposed in the opening 21H and the diffusion region 16 is then formed by impurity diffusion. This causes the high refractive index layer 15B to act as a stop layer for vapor phase diffusion. As a result, vapor phase diffusion does not reach the active layer 13. This makes it possible to prevent an electrical short circuit between the diffusion region 16 and the active layer 13.

In the method of manufacturing the surface emitting laser 1 according to the present embodiment, the spacer layer 14 is formed between the diffusion region 16 and the active layer 13 and the mesa section 20a is formed not to include the spacer layer 14. This causes the spacer layer 14 to act as a stop layer for vapor phase diffusion. As a result, vapor phase diffusion does not reach the active layer 13. This makes it possible to prevent an electrical short circuit between the diffusion region 16 and the active layer 13.

In the method of manufacturing the surface emitting laser 1 according to the present embodiment, the Al composition ratio a3 of $Al_{a3}Ga_{1-a3}As$ in the low refractive index layer 15A is higher than the Al composition ratio a4 of $Al_{a4}Ga_{1-a4}As$ in the high refractive index layer 15B. Therefore, of the low refractive index layer 15A and the high refractive index layer 15B exposed in the opening 21H, the low refractive index layer 15A having a relatively high Al composition ratio has a relatively higher diffusion rate than that of the high refractive index layer 15B in a case of vapor phase diffusion. As a result, p-type impurities are preferentially diffused in the low refractive index layer 15A and the diffusion region 16 has a comb shape. In this case, it is possible to control the thickness of the diffusion region 16 in the stacking direction by using the number of low refractive index layers 15A exposed in the opening 21H. It is thus possible to control the distance of the diffusion region 16 from the active layer 13 with accuracy.

In the method of manufacturing the surface emitting laser 1 according to the present embodiment, the DBR layer 15 is of an n-type electrical conduction type and the diffusion region 16 is a p-type electrical conduction type. It is extremely easy to diffuse p-type electrical conduction type of impurities in an n-type electrical conduction type of semiconductor layer. It is thus possible to easily form the diffusion region 16 in the DBR layer 15.

2. Second Embodiment

[Configuration]

Next, a surface emitting laser 2 according to a second embodiment of the present disclosure is described. FIG. 17 illustrates a cross-sectional configuration example of the surface emitting laser 2.

The surface emitting laser 2 is a back-surface emitting laser that is favorably applicable to a light source or the like for a sensor required to have high-power and stable light intensity distribution. The light source for a sensor is used, for example, for object detection, object recognition, night vision (imaging is performed without being sensed by a person), distance measurement, and the like. The light source for a sensor is applicable in a wide range, for example, a car collision preventing sensor, smartphone face authentication, monitoring, security, military use, and the like.

The surface emitting laser 2 includes a vertical resonator on a substrate 30. The vertical resonator is configured to be oscillated by two DBR layers 31 and 35 at the oscillation wavelength $\lambda_0$. The two DBR layers 31 and 35 are opposed to each other in the normal direction of the substrate 30. The DBR layer 31 corresponds to a specific example of the "first DBR layer" of the present disclosure. The DBR layer 35 corresponds to a specific example of the "second DBR layer" of the present disclosure. The DBR layer 31 is formed, for example, in contact with the top surface of the substrate 30. The DBR layer 35 is formed, for example, at a position relatively away from the substrate 30 (i.e., position closer to a light output surface 2S described below) in comparison with the DBR layer 31. The surface emitting laser 2 is configured to output the laser light L from the DBR layer 35 side. Therefore, the surface emitting laser 2 is a top-surface emitting laser having the light output surface 2S on the top surface.

The surface emitting laser 2 includes a semiconductor stacked structure on the substrate 30. The semiconductor stacked structure includes the DBR layer 31, a spacer layer 32, an active layer 33, a spacer layer 34, the DBR layer 35, and a contact layer 41 in this order from the substrate 30 side. The spacer layer 34 corresponds to a specific example of the "third semiconductor layer" of the present disclosure. The semiconductor stacked structure includes a columnar mesa section 30a on the DBR layer 35 side and further includes an annular diffusion region 36 at the outer edge of the mesa section 30a. The columnar mesa section 30a includes the DBR layer 35, but does not include the active layer 33.

The surface emitting laser 2 further includes electrode layers 37 and 38 for injecting currents into the semiconductor stacked structure. The electrode layer 37 is formed, for example, in contact with the back surface of the substrate 30. The electrode layer 37 is formed in contact with a portion of the back surface of the substrate 30 opposed to the opening of the diffusion region 36. The electrode layer 38 is formed, for example, in contact with the top surface of the mesa portion 30a (e.g., DBR layer 35). The electrode layer 38 has an opening in a portion of the top surface of the mesa section 30a (e.g., DBR layer 35) opposed to the opening of the diffusion region 36. It is preferable that the opening diameter d1 of the electrode layer 38 be equal to or larger than an opening diameter d2 of the diffusion region 36 in consideration of influence of the electrode layer 38 blocking light. A portion of the top surface of the mesa section 30a (e.g., DBR layer 35) opposed to the opening of the electrode layer 38 serves as the light output surface 2S. The surface emitting laser 2 further includes an insulating layer 39 covering the mesa section 30a. The electrode layers 37 and 38 are not covered with the insulating layer 39, but are exposed to the outside.

The substrate 30 is a crystal growth substrate used for the epitaxial crystal growth of a semiconductor stacked structure. The substrate 30 and the semiconductor stacked structure each include, for example, a GaAs-based semiconductor.

The substrate 30 is a substrate that transmits light emitted from the active layer 33. For example, the substrate 30 is a p-type GaAs substrate. The p-type GaAs substrate includes, for example, zinc (Zn), carbon (C), magnesium (Mg), beryllium (Be), or the like as a p-type impurity. The DBR layer 31 is a p-type DBR layer. The DBR layer 31 is, for example, a multilayer film reflecting mirror obtained by alternately stacking low refractive index layers and high refractive index layers. The low refractive index layers each include, for example, p-type $Al_{a1}Ga_{1-a1}As$ (0<a1<1) having an optical thickness of $\lambda_0/4$. The oscillation wavelength $\lambda_0$ is, for example, 940 nm. The high refractive index layers each include, for example, p-type $Al_{a2}Ga_{1-a2}As$ (0≤a2<a1) having an optical thickness of $\lambda_0/4$. The low refractive index layers each include a material having a higher Al (aluminum) composition ratio than that of a high refractive index layer. The DBR layer 31 includes, for example, zinc (Zn), carbon (C), magnesium (Mg), beryllium (Be), or the like as a p-type impurity. In the DBR layer 31, for example, a1 is 0.9, a2 is 0.1, and the number of pairs of low refractive index layers and high refractive index layers is 22.

The active layer 33 is designed in accordance with the oscillation wavelength $\lambda_0$ and use. The active layer 33 includes, for example, a stack in which well layers and barrier layers are alternately stacked. The well layer includes, for example, $In_{0.05}Ga_{0.95}As$ having a thickness of 5 nm. The barrier layer includes, for example, $Al_{0.1}Ga_{0.9}As$ having a thickness of 5 nm. The spacer layer 32 includes, for example, p-type GaAs. The spacer layer 32 includes, for example, zinc (Zn), carbon (C), magnesium (Mg), beryllium (Be), or the like as a p-type impurity. The spacer layer 34 is formed between the active layer 33 and the DBR layer 35. More specifically, the spacer layer 34 is formed between the diffusion region 36 and the active layer 33. The spacer layer 34 includes a semiconductor layer having a lower Al composition ratio than that of a low refractive index layer 35A described below. The spacer layer 34 includes, for example, n-type GaAs. The spacer layer 34 includes, for example, silicon (Si) and the like as an n-type impurity. The total optical thickness of the spacer layer 32, the active layer 33, and the spacer layer 34 is, for example, equal to the oscillation wavelength $\lambda_0$. The region of the active layer 33 opposed to an opening of the diffusion region 36 serves as a light emitting region when a current is injected into the surface emitting laser 2.

The DBR layer 35 is an n-type DBR layer. The DBR layer 35 is, for example, a multilayer film reflecting mirror obtained by alternately stacking the low refractive index layers 35A and high refractive index layers 35B as illustrated in FIG. 18. The low refractive index layers 35A each correspond to a specific example of the "first semiconductor layer" of the present disclosure. The high refractive index layers 35B each correspond to a specific example of the "second semiconductor layer" of the present disclosure. The low refractive index layer 35A is a semiconductor layer having a relatively higher Al composition ratio than that of the high refractive index layer 35B. The low refractive index layer 35A includes, for example, n-type $Al_{a3}Ga_{1-a3}As$ (0<a3<1) having an optical thickness of $\lambda_0/4$. The high refractive index layer 35B is a semiconductor layer having a relatively lower Al composition ratio than that of the low refractive index layer 35A. The high refractive index layer 35B includes, for example, n-type $Al_{a4}Ga_{1-a4}As$ (0≤a4<a3) having an optical thickness of $\lambda_0/4$. The low refractive index layer 35A includes a material having a higher Al (aluminum) composition ratio than that of the high refractive index layer 35B. The Al composition ratio of $Al_{a3}Ga_{1-a3}As$ in the low refractive index layer 35A is higher than the Al composition ratio of $Al_{a4}Ga_{1-a4}As$ in the high refractive index layer 35B. The DBR layer 35 includes, for example, silicon (Si) and the like as an n-type impurity. In the DBR layer 35, for example, a3 is 0.9, a4 is 0.1, and the number of pairs of the low refractive index layers 35A and the high refractive index layers 35B is 20, which is smaller than the number of pairs in the DBR layer 31.

The diffusion region 36 confines the current injected into the active layer 33. The diffusion region 36 is an impurity diffusion region of an electrical conduction type (p type) different from the electrical conduction type (n type) of the DBR layer 35. The diffusion region 36 has an opening for confining the current injected into the active layer 33. The diameter d2 of the opening of the diffusion region 36 is, for example, 6.6 μm, 8.8 μm, or 14.4 μm. The diffusion region 36 has, for example, a ring shape. For example, as illustrated in FIG. 18, the diffusion region 36 includes a plurality of layered diffusion sections 36A. The diffusion sections 36A are each formed at the end of the low refractive index layer 35A and have, for example, a ring shape. The diffusion region 36 is provided in every low refractive index layer 35A in the DBR layer 35 and has a comb shape. The diffusion region 36 is formed in every low refractive index layer 35A in the DBR layer 35 by impurity diffusion in the DBR layer 35. The one or more high refractive index layers 35B are formed between the diffusion region 36 and the active layer 33. The one or more high refractive index layers 35B are closer to the active layer 33 in the DBR layer 35.

The contact layer 41 is for electrically coupling the DBR layer 35 and the electrode layer 38 to each other and securing a current path in the mesa section 30a. The contact layer 41 is provided between the DBR layer 35 (diffusion region 36) and the electrode layer 38. For example, as with the high refractive index layer 35B, the contact layer 41 is a semiconductor layer having a relatively lower Al composition ratio than that of the low refractive index layer 35A. The contact layer 41 includes, for example, n-type $Al_{a5}Ga_{1-a5}As$ (0≤a5<a3) having a thickness of 0.3 μm.

The electrode layers 37 and 38 each have a role as an external terminal of the surface emitting laser 2. The electrode layer 37 is electrically coupled to the substrate 30. The electrode layer 37 is provided at least at a portion opposed to the opening of the diffusion region 36 and is formed in contact with the back surface of the substrate 30. The electrode layer 37 has, for example, a circular shape. The electrode layer 37 includes, for example, titanium (Ti), platinum (Pt), and gold (Au) that are stacked in this order from the substrate 30 side. The electrode layer 38 is formed in contact with the top surface of the mesa section 30a. The electrode layer 38 has an annular shape and has at least an opening at a portion opposed to the opening of the diffusion region 36. The electrode layer 38 has a structure in which, for example, an alloy of gold (Au) and germanium (Ge), nickel (Ni), and gold (Au) are stacked in order from the top surface side of the DBR layer 35. The electrode layer 38 is electrically coupled to the DBR layer 35. The insulating layer 39 is formed by using an insulating material. The insulating layer 39 is formed by using, for example, SiN or $Al_2O_3$.

[Manufacturing Method]

Next, a method of manufacturing the surface emitting laser 2 according to the present embodiment is described.

To manufacture the surface emitting laser 2, a compound semiconductor is collectively formed on the substrate 30 including, for example, p-type GaAs, for example, in an epitaxial crystal growth method such as an MOCVD method.

First, a semiconductor stacked structure is formed on the surface of the substrate 30, for example, in an epitaxial crystal growth method such as a MOCVD method. The semiconductor stacked structure includes the DBR layer 31, the spacer layer 32, the active layer 33, the spacer layer 34, the DBR layer 35, and the contact layer 41. Next, for example, a circular resist layer is formed. Afterward, the contact layer 41 and the DBR layer 35 are each selectively etched with this resist layer used as a mask and the semiconductor stacked structure is etched to depth that does not reach the active layer 33. In this case, it is preferable to use, for example, RIE with a Cl-based gas. In this way, the mesa section 30a is formed that includes the contact layer 41 and the DBR layer 35, but does not include the active layer 33. In this case, the mesa section 30a is formed not to include the spacer layer 34.

Next, the electrode layer 38 and the electrode layer 37 are formed. The electrode layer 38 is in contact with the top surface of the mesa section 30a (e.g., contact layer 41). The electrode layer 37 is in contact with the back surface of the substrate 30. Afterward, an insulating layer 39a is formed that covers the mesa section 30a and the electrode layer 38 and an opening 39H is then formed in the insulating layer 39a by isotropic etching such as wet etching (FIG. 19). Specifically, the opening 39H is formed on the side surface of the mesa section 30a that is a portion having relatively less film thickness in the insulating layer 39a. In this case, the opening 39H may be formed to prevent the end surfaces of the one or more high refractive index layers 35B closer to the active layer 33 in the DBR layer 35 from being exposed in the opening 39H (FIG. 19).

In this way, the insulating layer 39a having the opening 39H is formed on the side surface of the mesa section 30a. Afterward, the annular diffusion region 36 is formed at the outer edge of the mesa portion 30a (FIG. 20) by impurity diffusion from the side surface of the mesa section 30a. The annular diffusion region 36 is of the electrical conduction type (p type) different from the electrical conduction type (n type) of the DBR layer 35. Specifically, the diffusion region 36 is formed by impurity diffusion via the opening 39H by vapor phase diffusion. In this case, as an impurity of electrical conduction type (p type) different from the electrical conduction type (n type) of the DBR layer 15, for example, Zn is diffused to form the diffusion region 36.

Here, the low refractive index layer 35A is a semiconductor layer having a relatively higher Al composition ratio than that of the high refractive index layer 35B. Therefore, of the low refractive index layer 35A and the high refractive index layer 35B exposed in the opening 39H, the low refractive index layer 35A having a relatively high Al composition ratio has a relatively higher diffusion rate than that of the high refractive index layer 35B. As a result, p-type impurities are preferentially diffused in the low refractive index layer 35A to form the diffusion region 36 in the shape of a comb (FIG. 20).

In this case, as with the high refractive index layer 35B, the spacer layer 34 is a semiconductor layer having a relatively lower Al composition ratio than that of the low refractive index layer 35A. Therefore, the spacer layer 34 acts as a stop layer for vapor phase diffusion. In addition, of the plurality of high refractive index layers 35B included in the DBR layer 35, the layer that is the closest to the active layer 33 also acts as a stop layer for vapor phase diffusion. This prevents vapor phase diffusion from reaching the active layer 33.

Next, an insulating layer is formed to fill the opening 39H, thereby forming the insulating layer 39. Subsequently, there is provided an opening in a portion of the insulating layer 39 opposed to the electrode layer 38 and the electrode layer 37 is further formed on the back surface of the substrate 30. In this way, the surface emitting laser 2 is manufactured.

[Operation]

When a predetermined voltage is applied between the electrode layer 37 electrically coupled to the DBR layer 31 and the electrode layer 38 electrically coupled to the DBR layer 35 in the surface emitting laser 2 having such a configuration, currents are injected into the active layer 33 through the opening of the diffusion region 36, thereby causing light emission to occur as a result of recombination of electrons and holes. As a result, the vertical resonator generates laser oscillation at the oscillation wavelength $\lambda_0$. Light leaking out of the DBR layer 35 is then outputted from the light output surface 2S to the outside as the beam-shaped laser light L.

[Effects]

Next, effects of the surface emitting laser 2 according to the present embodiment are described.

In the surface emitting laser 2 according to the present embodiment, the annular diffusion region 36 of an electrical conduction type (p type) different from the electrical conduction type (n type) of the DBR layer 35 is formed at the outer edge of the mesa section 30a. Here, in the diffusion region 36, a high refractive index difference as caused by oxide confinement is not caused. The high-order mode is therefore unlikely to occur even in a case where the current confinement diameter is increased. In addition, the current concentration at the confinement end as in oxide confinement does not occur in the diffusion region 36. This suppresses the acceleration of defect growth. It is thus possible to increase reliability while both suppressing the high-order mode and attaining higher-power output.

In the surface emitting laser 2 according to the present embodiment, the diffusion region 36 is provided in every low refractive index layer 35A in the DBR layer 35 and has a comb shape. This prevents local current confinement in the DBR layer 35 in the thickness direction and thus makes it possible to increase reliability.

In the surface emitting laser 2 according to the present embodiment, the high refractive index layer 35B is formed between the diffusion region 36 and the active layer 33. The high refractive index layer 35B is closer to the active layer 33 in the DBR layer 35. This causes the high refractive index layer 35B to act as a stop layer for vapor phase diffusion. As a result, vapor phase diffusion does not reach the active layer 33. This makes it possible to prevent an electrical short circuit between the diffusion region 36 and the active layer 33.

In the surface emitting laser 2 according to the present embodiment, the spacer layer 34 is formed between the diffusion region 36 and the active layer 33. This causes the spacer layer 34 to act as a stop layer for vapor phase diffusion. As a result, vapor phase diffusion does not reach the active layer 33. This makes it possible to prevent an electrical short circuit between the diffusion region 36 and the active layer 33.

In the surface emitting laser 2 according to the present embodiment, the Al composition ratio a3 of $Al_{a3}Ga_{1-a3}As$ in the low refractive index layer 35A is higher than the Al composition ratio a4 of $Al_{a4}Ga_{1-a4}As$ in the high refractive index layer 35B. Therefore, of the low refractive index layer 35A and the high refractive index layer 35B exposed in the opening of the insulating layer, the low refractive index layer 35A having a relatively high Al composition ratio has a relatively higher diffusion rate than that of the high refractive index layer 35B in a case of vapor phase diffusion. As a result, p-type impurities are preferentially diffused in the low refractive index layer 35A and the diffusion region 36 has a comb shape. In this case, it is possible to control the thickness of the diffusion region 36 in the stacking direction by using the number of low refractive index layers 35A exposed in the opening of the insulating layer. It is thus possible to control the distance of the diffusion region 36 from the active layer 33 with accuracy.

In the surface emitting laser 2 according to the present embodiment, the DBR layer 35 is of an n-type electrical conduction type and the diffusion region 36 is a p-type electrical conduction type. It is extremely easy to diffuse p-type electrical conduction type of impurities in an n-type electrical conduction type of semiconductor layer. It is thus possible to easily form the diffusion region 36 in the DBR layer 35.

In the method of manufacturing the surface emitting laser 2 according to the present embodiment, the mesa section 30a is formed at a portion on the DBR layer 35 side in the semiconductor stacked structure and the p-type annular diffusion region 36 is then formed at the outer edge of the mesa section 30a by impurity diffusion from the side surface of the mesa section 30a. The mesa section 30a includes the DBR layer 35, but does not include the active layer 33. Here, in the diffusion region 36, a high refractive index difference as caused by oxide confinement is not caused. The high-order mode is therefore unlikely to occur even in a case where the current confinement diameter is increased. In addition, the current concentration at the confinement end as in oxide confinement does not occur in the diffusion region 36. This suppresses the acceleration of defect growth. It is thus possible to increase reliability while both suppressing the high-order mode and attaining higher-power output.

In the method of manufacturing the surface emitting laser 2 according to the present embodiment, the insulating layer 39a having the opening 39H is formed on the side surface of the mesa section 30a and the diffusion region 36 is then formed by impurity diffusion via the opening 39H. This makes it possible to selectively perform vapor phase diffusion on a portion of the DBR layer 35 exposed in the opening 39H. It is thus possible to control the distance of the diffusion region 36 from the active layer 33 with accuracy.

In the method of manufacturing the surface emitting laser 2 according to the present embodiment, the opening 39H is formed in the insulating layer 39a by isotropic etching. In this way, it is possible to form the opening 39H at a portion of the insulating layer 39a opposed to the side surface of the DBR layer 35 in a simple method. This makes it possible to form the diffusion region 36 in a simple method.

In the method of manufacturing the surface emitting laser 2 according to the present embodiment, the insulating layer 39a is formed and the diffusion region 36 is then formed in the shape of a comb by impurity diffusion in each low refractive index layer 35A exposed in the opening 39H. In this case, it is possible to control the thickness of the diffusion region 36 in the stacking direction by using the number of low refractive index layers 35A exposed in the opening 39H. It is thus possible to control the distance of the diffusion region 36 from the active layer 33 with accuracy.

In the method of manufacturing the surface emitting laser 2 according to the present embodiment, the opening 39H is formed to prevent the end surfaces of the one or more high refractive index layers 35B closer to the active layer 33 in the DBR layer 35 from being exposed in the opening 39H and the diffusion region 36 is then formed by impurity diffusion. This causes the high refractive index layer 35B to act as a stop layer for vapor phase diffusion. As a result, vapor phase diffusion does not reach the active layer 33. This makes it possible to prevent a short circuit between the diffusion region 36 and the active layer 33.

In the method of manufacturing the surface emitting laser 2 according to the present embodiment, the spacer layer 34 is formed between the diffusion region 36 and the active layer 33 and the mesa section 30a is formed not to include the spacer layer 34. This causes the spacer layer 34 to act as a stop layer for vapor phase diffusion. As a result, vapor phase diffusion does not reach the active layer 33. This makes it possible to prevent a short circuit between the diffusion region 36 and the active layer 33.

In the method of manufacturing the surface emitting laser 2 according to the present embodiment, the Al composition ratio a3 of $Al_{a3}Ga_{1-a3}As$ in the low refractive index layer 35A is higher than the Al composition ratio a4 of $Al_{a4}Ga_{1-a4}As$ in the high refractive index layer 35B. Therefore, of the low refractive index layer 35A and the high refractive index layer 35B exposed in the opening 39H of the insulating layer 39a, the low refractive index layer 35A having a relatively high Al composition ratio has a relatively higher diffusion rate than that of the high refractive index layer 35B in a case of vapor phase diffusion. As a result, p-type impurities are preferentially diffused in the low refractive index layer 35A and the diffusion region 36 has a comb shape. In this case, it is possible to control the thickness of the diffusion region 36 in the stacking direction by using the number of low refractive index layers 35A exposed in the opening 39H. It is thus possible to control the distance of the diffusion region 36 from the active layer 33 with accuracy.

In the method of manufacturing the surface emitting laser 2 according to the present embodiment, the DBR layer 35 is of an n-type electrical conduction type and the diffusion region 36 is a p-type electrical conduction type. It is extremely easy to diffuse p-type electrical conduction type of impurities in an n-type electrical conduction type of semiconductor layer. It is thus possible to easily form the diffusion region 36 in the DBR layer 35.

Although the present disclosure has been described above with reference to the embodiments and the modification example thereof, the present disclosure is not limited the above-described embodiments and the like. The present disclosure may be modified in a variety of ways. It is to be noted that the effects described herein are merely illustrative. The effects of the present disclosure are not limited to the effects described herein. The present disclosure may have effects other than the effects described herein.

In addition, for example, it is possible to configure the present disclosure as follows.

(1)

A method of manufacturing a surface emitting laser, the method including:

a first step of forming a semiconductor stacked structure on a substrate, the semiconductor stacked structure including an active layer, a first DBR (distributed Bragg reflector) layer of a first electrical conduction type, and a second DBR layer of a second electrical conduction type, the first DBR layer and the second DBR layer sandwiching the active layer, the second electrical conduction type being different from the first electrical conduction type; and a second step of forming a mesa section at a portion on the second DBR layer side in the semiconductor stacked structure and then forming an annular diffusion region of the first electrical conduction type at an outer edge of the mesa section by impurity diffusion from a side surface of the mesa section, the mesa section including the second DBR layer, the mesa section not including the active layer.

(2)

The method of manufacturing the surface emitting laser according to (1), in which an insulating layer having an opening is formed on the side surface of the mesa section and the diffusion region is then formed by the impurity diffusion via the opening in the second step.

(3)

The method of manufacturing the surface emitting laser according to (2), in which the opening is formed in the insulating layer by isotropic etching in the second step.

(4)

The method of manufacturing the surface emitting laser according to (2) or (3), in which the second DBR layer includes a multilayer film reflecting mirror in which a plurality of first semiconductor layers and a plurality of second semiconductor layers are alternately stacked, the plurality of first semiconductor layers each having a relatively high Al composition ratio, the plurality of second semiconductor layers each having a relatively low Al composition ratio, and the insulating layer is formed and the diffusion region is then formed in a shape of a comb by the impurity diffusion in each of the first semiconductor layers exposed in the opening in the second step.

(5)

The method of manufacturing the surface emitting laser according to (4), in which the opening is formed to prevent end surfaces of the one or more second semiconductor layers closer to the active layer in the second DBR layer from being exposed in the opening and the diffusion region is then formed by the impurity diffusion in the second step.

(6)

The method of manufacturing the surface emitting laser according to (4) or (5), in which the semiconductor stacked structure includes a third semiconductor layer between the active layer and the second DBR layer, the third semiconductor layer having a lower Al composition ratio than the Al composition ratio of each of the first semiconductor layers, and the mesa section is formed not to include the third semiconductor layer in the second step.

(7)

The method of manufacturing the surface emitting laser according to any one of (4) to (6), in which the second DBR layer includes $Al_xGa_{1-x}As$ ($0 \leq x \leq 1$), and an Al composition ratio of $Al_xGa_{1-x}As$ in each of the first semiconductor layers is higher than an Al composition ratio of $Al_xGa_{1-x}As$ in each of the second semiconductor layers.

(8)

The method of manufacturing the surface emitting laser according to any one of (1) to (7), in which the first electrical conduction type includes a p type and the second electrical conduction type includes an n type.

(9)

A surface emitting laser including a semiconductor stacked structure including an active layer, a first DBR (distributed Bragg reflector) layer of a first electrical conduction type, and a second DBR layer of a second electrical conduction type, the first DBR layer and the second DBR layer sandwiching the active layer, the second electrical conduction type being different from the first electrical conduction type, in which the semiconductor stacked structure includes a mesa section on the second DBR layer side and further includes an annular diffusion region of the first electrical conduction type at an outer edge of the mesa section, the mesa section including the second DBR layer, the mesa section not including the active layer.

(10)

The surface emitting laser according to (9), in which the second DBR layer includes a multilayer film reflecting mirror in which a plurality of first semiconductor layers and a plurality of second semiconductor layers are alternately stacked, the plurality of first semiconductor layers each having a relatively high Al composition ratio, the plurality of second semiconductor layers each having a relatively low Al composition ratio, and the diffusion region is provided in a shape of a comb to all or a portion of the plurality of first semiconductor layers.

(11)

The surface emitting laser according to (10), in which the one or more second semiconductor layers closer to the active layer in the second DBR layer are formed between the diffusion region and the active layer.

(12)

The surface emitting laser according to (10) or (11), in which the semiconductor stacked structure includes a third semiconductor layer between the active layer and the second DBR layer, the third semiconductor layer having a lower Al composition ratio than the Al composition ratio of each of the first semiconductor layers, and the third semiconductor layer is formed between the diffusion region and the active layer.

(13)

The surface emitting laser according to any one of (10) to (12), in which the second DBR layer includes $Al_xGa_{1-x}As$ ($0 \leq x \leq 1$), and an Al composition ratio of $Al_xGa_{1-x}As$ in each of the first semiconductor layers is higher than an Al composition ratio of $Al_xGa_{1-x}As$ in each of the second semiconductor layers.

(14)

The surface emitting laser according to any one of (9) to (13), in which the first electrical conduction type includes a p type and the second electrical conduction type includes an n type.

In the method of manufacturing the surface emitting laser according to the embodiment of the present disclosure, the annular diffusion region of the electrical conduction type different from the electrical conduction type of the second DBR layer is formed at the outer edge of the mesa section by the impurity diffusion from the side surface of the mesa section. It is thus possible to increase reliability while both suppressing the high-order mode and attaining higher-power output.

In the surface emitting laser according to the embodiment of the present disclosure, the annular diffusion region of the electrical conduction type different from the electrical conduction type of the second DBR layer is formed at the outer edge of the mesa section. It is thus possible to increase reliability while both suppressing the high-order mode and attaining higher-power output.

It is to be noted that the effects of the present disclosure are not necessarily limited to the effects described here, but may include any of the effects described herein.

This application claims the priority on the basis of Japanese Patent Application No. 2018-136388 filed on Jul. 20, 2018 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A method of manufacturing a surface emitting laser, the method comprising:
a first step of forming a semiconductor stacked structure on a substrate, the semiconductor stacked structure including an active layer, a first DBR (distributed Bragg reflector) layer of a first electrical conduction type, and a second DBR layer of a second electrical conduction type, the first DBR layer and the second DBR layer sandwiching the active layer, the second electrical conduction type being different from the first electrical conduction type; and
a second step of forming a mesa section at a portion on the second DBR layer side in the semiconductor stacked structure and then forming an annular diffusion region of the first electrical conduction type at an outer edge of the mesa section by impurity diffusion from a side surface of the mesa section, the mesa section including the second DBR layer, the mesa section not including the active layer.

2. The method of manufacturing the surface emitting laser according to claim 1, wherein an insulating layer having an opening is formed on the side surface of the mesa section and the diffusion region is then formed by the impurity diffusion via the opening in the second step.

3. The method of manufacturing the surface emitting laser according to claim 2, wherein the opening is formed in the insulating layer by isotropic etching in the second step.

4. The method of manufacturing the surface emitting laser according to claim 2, wherein
the second DBR layer includes a multilayer film reflecting mirror in which a plurality of first semiconductor layers and a plurality of second semiconductor layers are alternately stacked, the plurality of first semiconductor layers each having a relatively high Al composition ratio, the plurality of second semiconductor layers each having a relatively low Al composition ratio, and
the insulating layer is formed and the diffusion region is then formed in a shape of a comb by the impurity diffusion in each of the first semiconductor layers exposed in the opening in the second step.

5. The method of manufacturing the surface emitting laser according to claim 4, wherein the opening is formed to prevent end surfaces of the one or more second semiconductor layers closer to the active layer in the second DBR layer from being exposed in the opening and the diffusion region is then formed by the impurity diffusion in the second step.

6. The method of manufacturing the surface emitting laser according to claim 4, wherein
the semiconductor stacked structure includes a third semiconductor layer between the active layer and the second DBR layer, the third semiconductor layer having a lower Al composition ratio than the Al composition ratio of each of the first semiconductor layers, and
the mesa section is formed not to include the third semiconductor layer in the second step.

7. The method of manufacturing the surface emitting laser according to claim 4, wherein
the second DBR layer includes $Al_xGa_{1-x}As$ ($0 \leq x \leq 1$), and
an Al composition ratio of $Al_xGa_{1-x}As$ in each of the first semiconductor layers is higher than an Al composition ratio of $Al_xGa_{1-x}As$ in each of the second semiconductor layers.

8. The method of manufacturing the surface emitting laser according to claim 1, wherein the first electrical conduction type includes a p type and the second electrical conduction type includes an n type.

9. A surface emitting laser comprising
a semiconductor stacked structure including an active layer, a first DBR (distributed Bragg reflector) layer of a first electrical conduction type, and a second DBR layer of a second electrical conduction type, the first DBR layer and the second DBR layer sandwiching the active layer, the second electrical conduction type being different from the first electrical conduction type, wherein
the semiconductor stacked structure includes a mesa section on the second DBR layer side and further includes an annular diffusion region of the first electrical conduction type at an outer edge of the mesa section, the mesa section including the second DBR layer, the mesa section not including the active layer.

10. The surface emitting laser according to claim 9, wherein
the second DBR layer includes a multilayer film reflecting mirror in which a plurality of first semiconductor layers and a plurality of second semiconductor layers are alternately stacked, the plurality of first semiconductor layers each having a relatively high Al composition ratio, the plurality of second semiconductor layers each having a relatively low Al composition ratio, and
the diffusion region is provided in a shape of a comb to all or a portion of the plurality of first semiconductor layers.

11. The surface emitting laser according to claim 10, wherein the one or more second semiconductor layers closer to the active layer in the second DBR layer are formed between the diffusion region and the active layer.

12. The surface emitting laser according to claim 10, wherein
the semiconductor stacked structure includes a third semiconductor layer between the active layer and the second DBR layer, the third semiconductor layer having a lower Al composition ratio than the Al composition ratio of each of the first semiconductor layers, and
the third semiconductor layer is formed between the diffusion region and the active layer.

13. The surface emitting laser according to claim 10, wherein
the second DBR layer includes $Al_xGa_{1-x}As$ ($0 \leq x \leq 1$), and
an Al composition ratio of $Al_xGa_{1-x}As$ in each of the first semiconductor layers is higher than an Al composition ratio of $Al_xGa_{1-x}As$ in each of the second semiconductor layers.

14. The surface emitting laser according to claim 9, wherein the first electrical conduction type includes a p type and the second electrical conduction type includes an n type.

* * * * *